US012582013B2

(12) United States Patent
Chen

(10) Patent No.: US 12,582,013 B2
(45) Date of Patent: Mar. 17, 2026

(54) CONFIGURATIONS FOR METAL POSTS FOR DUAL SIDE MOLD MODULES

(71) Applicant: SKYWORKS SOLUTIONS, INC., Irvine, CA (US)

(72) Inventor: Howard E. Chen, Anaheim, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 548 days.

(21) Appl. No.: 17/706,883

(22) Filed: Mar. 29, 2022

(65) Prior Publication Data

US 2022/0319968 A1     Oct. 6, 2022

Related U.S. Application Data

(60) Provisional application No. 63/168,856, filed on Mar. 31, 2021.

(51) Int. Cl.
H01L 23/498     (2006.01)
H01L 21/48     (2006.01)
(Continued)

(52) U.S. Cl.
CPC .... H01L 23/49811 (2013.01); H01L 21/4853 (2013.01); H01L 21/561 (2013.01); H01L 21/565 (2013.01); H01L 23/49816 (2013.01); H01L 23/49838 (2013.01); H01L 23/49866 (2013.01); H01L 23/552 (2013.01); H01L 23/66 (2013.01); H01L 25/105 (2013.01); H01L 2223/6616 (2013.01); H01L 2223/6655 (2013.01); H01L 2223/6677 (2013.01)

(58) Field of Classification Search
CPC ......... H01L 23/49811; H01L 23/49866; H01L 25/105; H01L 21/561; H01L 24/97
USPC ......................................................... 257/690
See application file for complete search history.

(56) References Cited

U.S. PATENT DOCUMENTS 10,636,765 B2     4/2020   Yang et al.
10,896,877 B1 *   1/2021   Yang ................... H01L 23/3128
                          (Continued)

FOREIGN PATENT DOCUMENTS

GB        2204642.9        3/2022
KR        101494414 B1     2/2015
                          (Continued)

*Primary Examiner* — Quoc D Hoang
(74) *Attorney, Agent, or Firm* — Chang & Hale LLP

(57)     ABSTRACT

A packaged module can include a packaging substrate with first and sides, first and second components mounted on the first and second sides, respectively, and first and second overmolds implemented on the first and second sides, respectively, with the second overmold defining a mounting surface. The packaged module can further include a plurality of conductive features implemented on the second side of the packaging substrate to provide electrical connections for the packaged module, with the conductive features being formed from conductive material having a sufficiently high melting temperature so that the conductive features do not melt during a mounting operation. Each conductive feature can have a surface that is substantially coplanar with or recessed with respect to the mounting surface, and a solderable material layer can be dimensioned to cover the surface of each conductive feature.

17 Claims, 13 Drawing Sheets

(51) Int. Cl.
<table>
<tr><td>*H01L 21/56*</td><td>(2006.01)</td></tr>
<tr><td>*H01L 23/552*</td><td>(2006.01)</td></tr>
<tr><td>*H01L 23/66*</td><td>(2006.01)</td></tr>
<tr><td>*H01L 25/10*</td><td>(2006.01)</td></tr>
</table>

(56)         References Cited

U.S. PATENT DOCUMENTS

| | | | |
|---|---|---|---|
| 2015/0098204 A1* | 4/2015 | Yoshikawa | H01L 23/00 |
| | | | 361/767 |
| 2018/0151485 A1 | 5/2018 | Kao et al. | |
| 2019/0057929 A1 | 2/2019 | Chen et al. | |
| 2019/0074267 A1* | 3/2019 | Yang | H01L 25/16 |

FOREIGN PATENT DOCUMENTS

| | | |
|---|---|---|
| SG | 10202203231Q | 3/2022 |
| TW | 201839936 A | 11/2018 |
| TW | 111112222 | 3/2022 |
| WO | 2018/067578 A1 | 4/2018 |

* cited by examiner

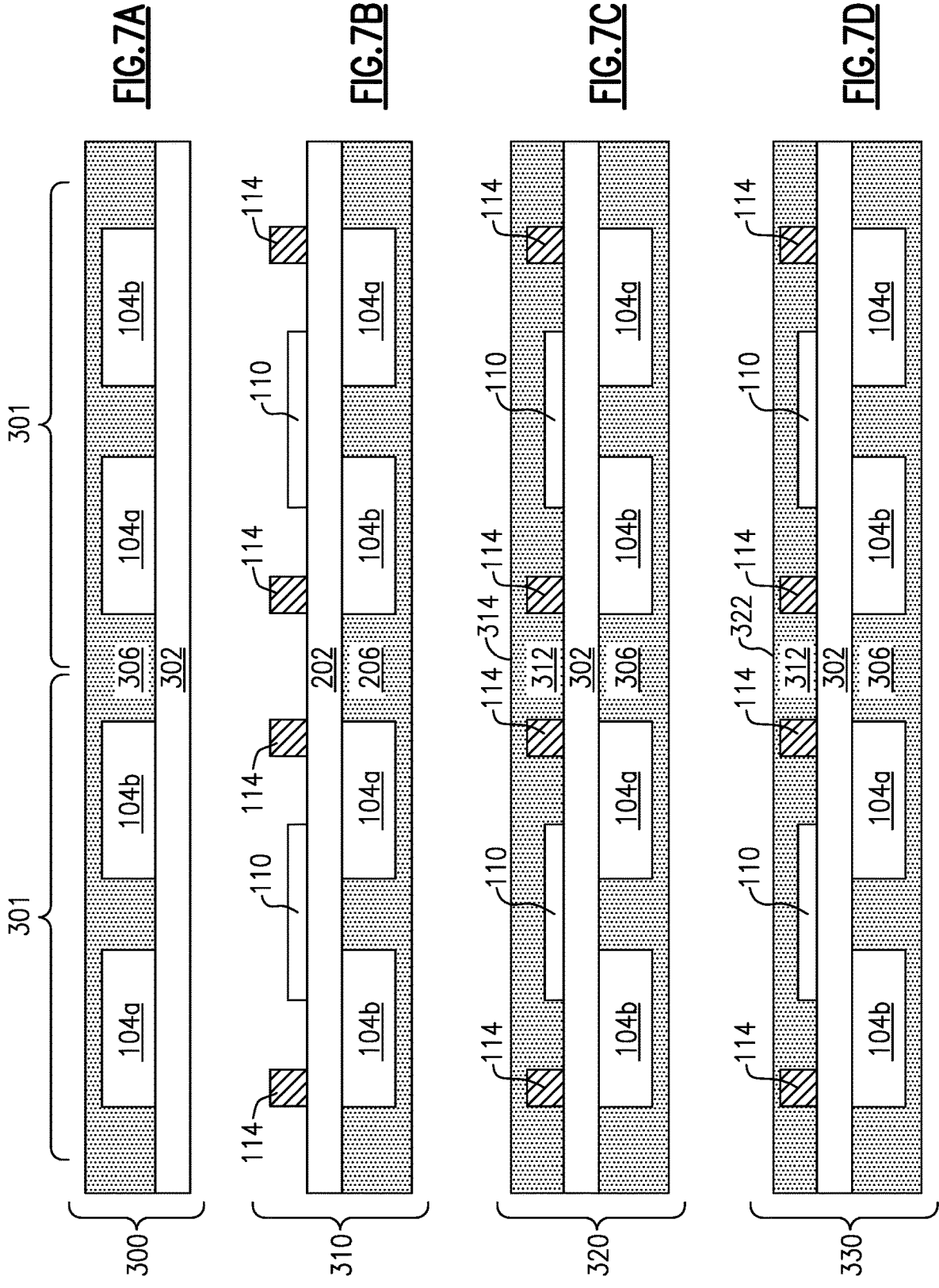

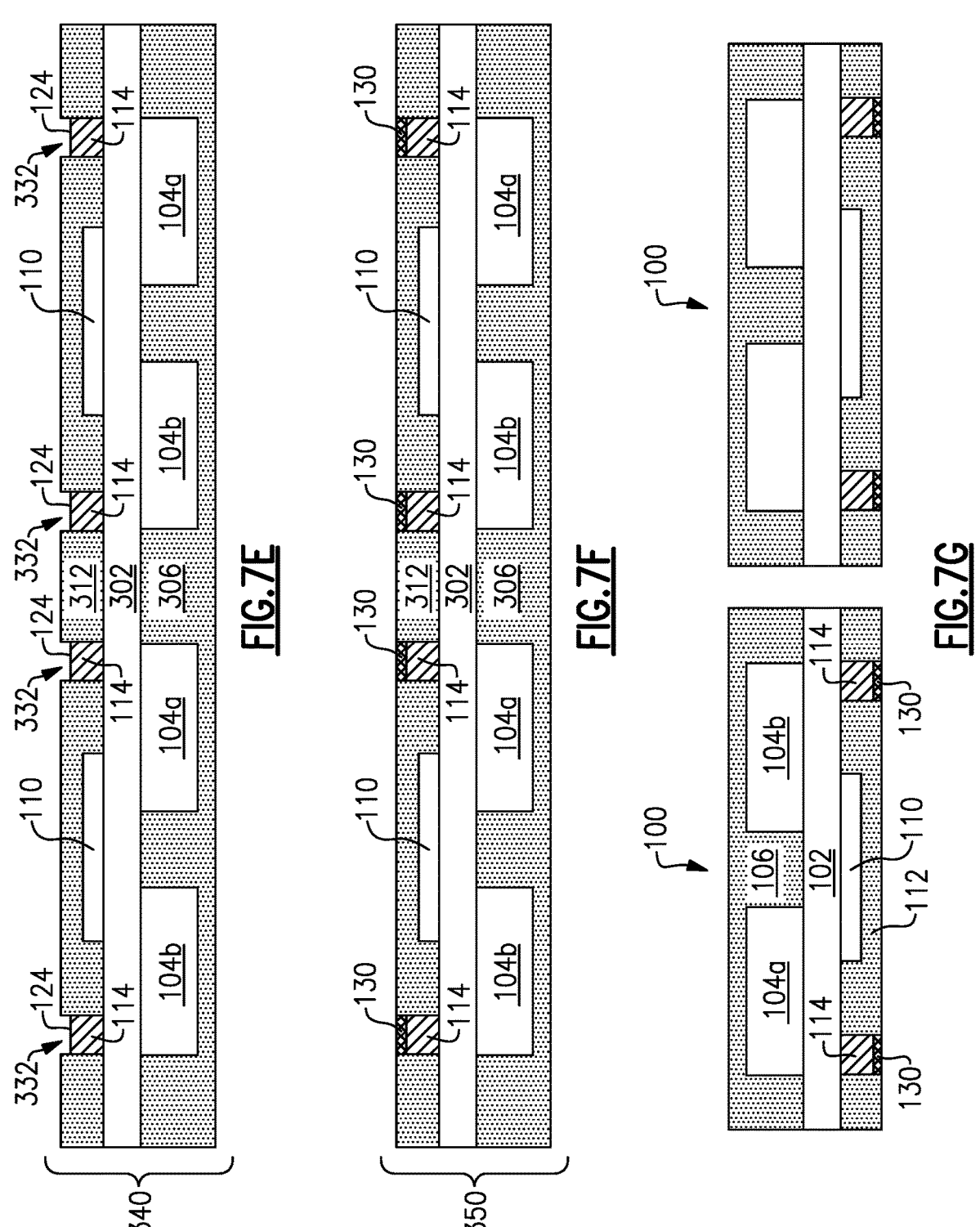

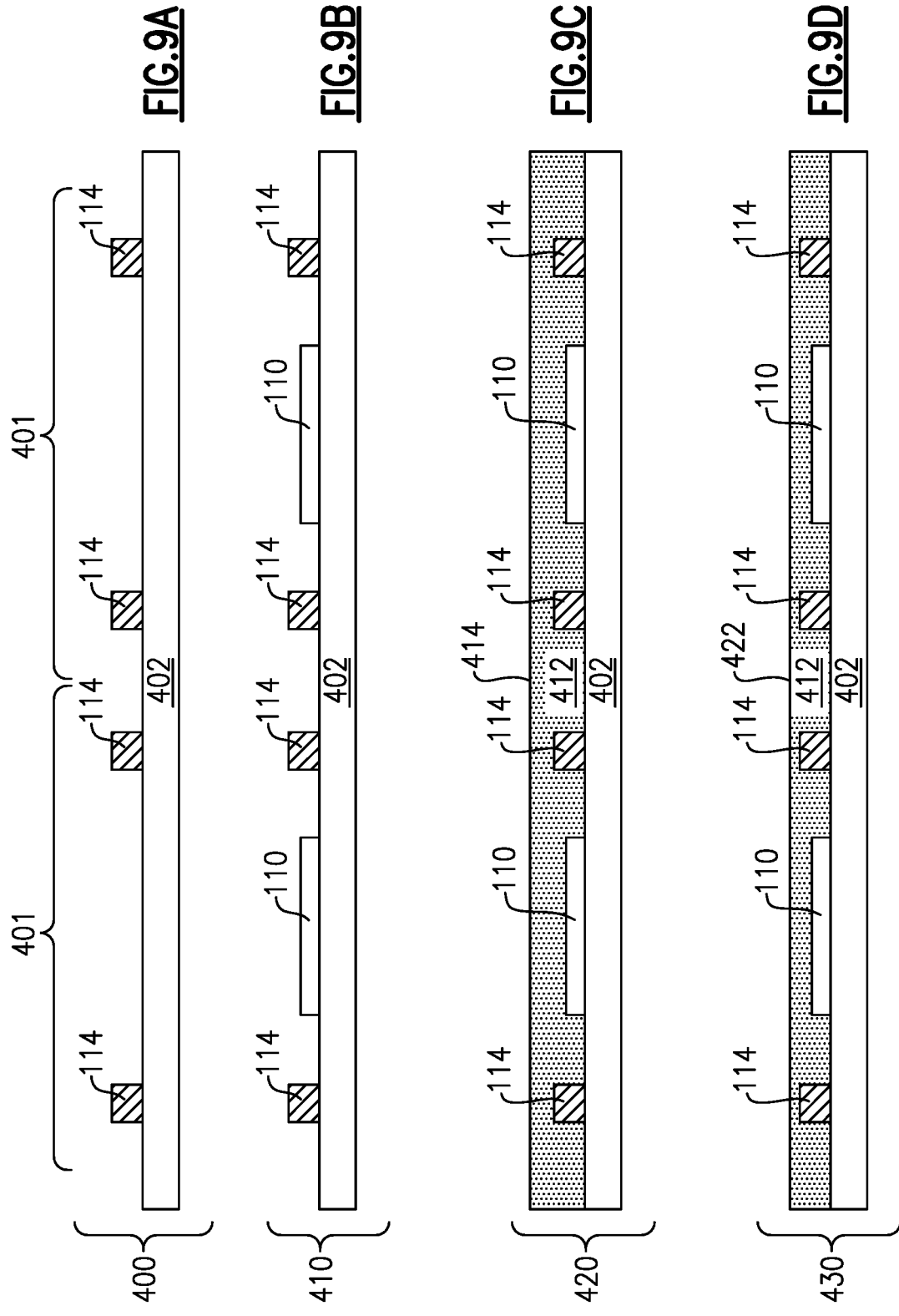

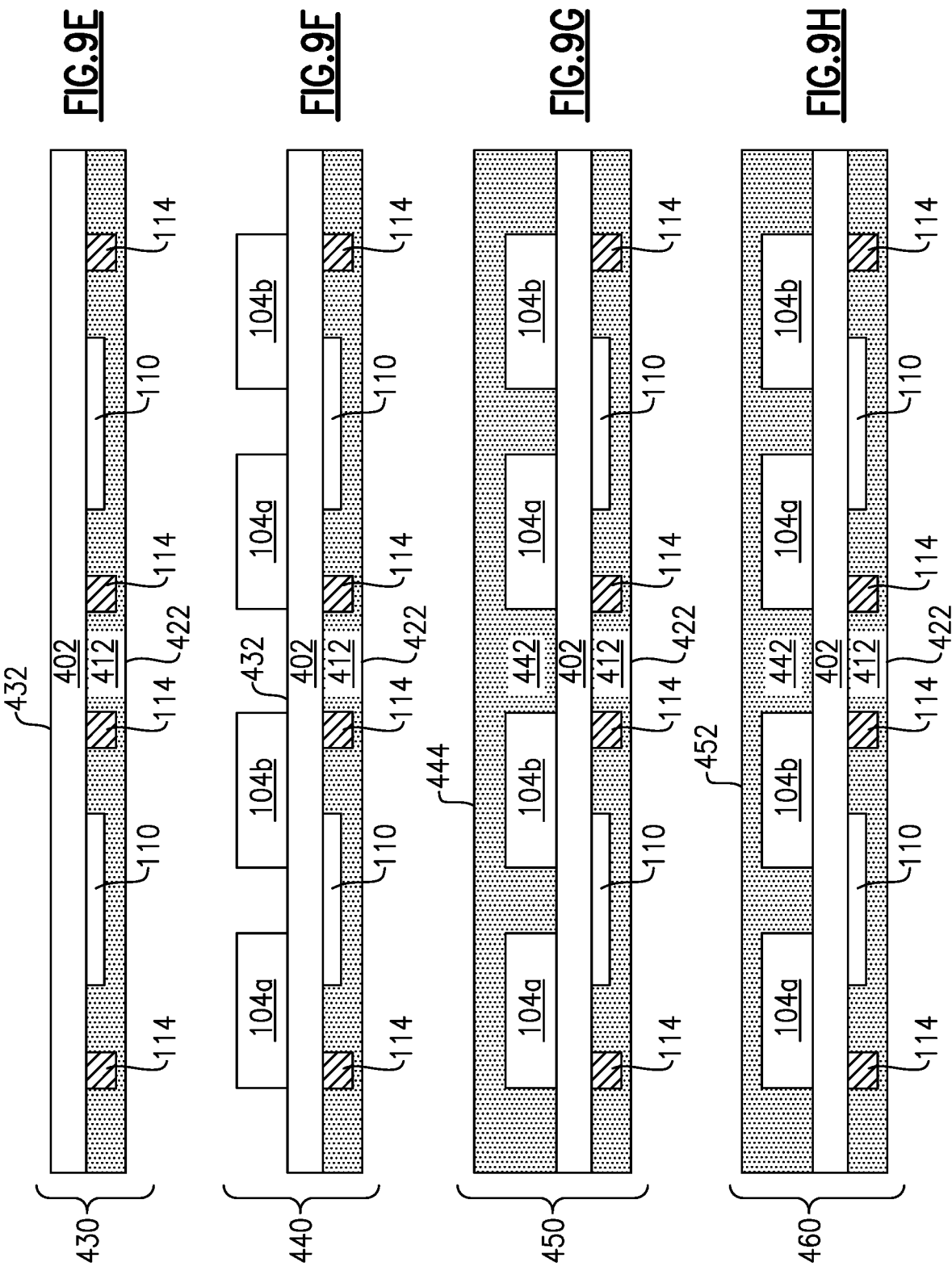

CONFIGURATIONS FOR METAL POSTS FOR DUAL SIDE MOLD MODULES

CROSS-REFERENCE TO RELATED APPLICATION(S)

This application claims priority to U.S. Provisional Application No. 63/168,856 filed Mar. 31, 2021, entitled MODULE HAVING DUAL SIDE MOLD WITH METAL POSTS, the disclosure of which is hereby expressly incorporated by reference herein in its respective entirety.

BACKGROUND

Field

The present disclosure relates to packaged electronic modules having dual side mold with metal posts.

Description of the Related Art

In electronic applications such as radio-frequency (RF) applications, circuits and related devices can be implemented in a packaged module. Such a packaged module can then be mounted on a circuit board such as a phone board.

SUMMARY

In accordance with some implementations, the present disclosure relates to a packaged module that includes a packaging substrate having a first side and a second side, first and second components mounted on the first and second sides of the packaging substrate, respectively, and first and second overmolds implemented on the first and second sides of the packaging substrate, respectively, with the second overmold defining a mounting surface to allow mounting of the packaged module on a circuit board. The packaged module further includes a plurality of conductive features implemented on the second side of the packaging substrate to provide electrical connections for the packaged module. The conductive features are formed from conductive material having a sufficiently high melting temperature so that the conductive features do not melt during a mounting operation. Each conductive feature has a surface that is substantially coplanar with or recessed with respect to the mounting surface of the second overmold. The packaged module further includes a solderable material layer dimensioned to cover the surface of each conductive feature.

In some embodiments, each conductive feature can be implemented as a conductive post. In some embodiments, the conductive material can include copper. In some embodiments, the mounting operation can include a reflow soldering operation.

In some embodiments, the surface of the conductive feature can be substantially coplanar with the mounting surface of the second overmold. The solderable material layer can have a thickness that protrudes beyond the mounting surface of the second overmold. The solderable material layer can include a lateral edge that extends laterally beyond a lateral boundary of the surface of the respective conductive feature.

In some embodiments, the surface of the conductive feature can be recessed with respect to the mounting surface of the second overmold. The solderable material layer can be dimensioned to partially or fully fill a recess defined by the surface of the respective conductive feature and the mounting surface of the second overmold. The solderable material layer can partially fill the recess such that an exposed surface of the solderable material layer and the mounting surface of the second overmold define a shallow recess. The solderable material layer can fully fill the recess such that an exposed surface of the solderable material layer is substantially coplanar with or protrudes beyond the mounting surface of the second overmold.

In some embodiments, packaged module can further include a shielding layer or a shielding feature configured to provide shielding functionality.

According to some teachings, the present disclosure relates to a method for fabricating a packaged module. The method includes forming or providing a packaging substrate having a first side and a second side, mounting a first component on the first side of the packaging substrate, forming a first overmold on the first side of the packaging substrate to encapsulate the first component, mounting a second component on the second side of the packaging substrate, implementing a plurality of conductive features on the second side of the packaging substrate to provide electrical connections for the packaged module, with the conductive features being formed from conductive material having a sufficiently high melting temperature so that the conductive features do not melt during a mounting operation, and forming a second overmold on the second side of the packaging substrate to encapsulate the second component and each of the conductive features. The method further includes removing a portion of the second overmold to expose a surface for each conductive feature, and providing a solderable material layer dimensioned to cover the surface of each conductive feature.

In some embodiments, the implementing of the conductive features can include mounting conductive posts to the second side of the packaging substrate. In some embodiments, the conductive material can include copper. In some embodiments, the mounting operation can include a reflow soldering operation.

In some embodiments, the removing of a portion of the second overmold can include a grinding operation that results in the surface of the conductive feature being substantially coplanar with the mounting surface of the second overmold. The providing of the solderable material layer can be implemented such that the solderable material layer has a thickness that protrudes beyond the mounting surface of the second overmold. The providing of the solderable material layer can be implemented such that the solderable material layer includes a lateral edge that extends laterally beyond a lateral boundary of the surface of the respective conductive feature.

In some embodiments, the removing of a portion of the second overmold can include forming a recess on the mounting surface of the second overmold to expose the surface of each conductive feature. The removing of a portion of the second overmold can further include removing a thickness of the second overmold, prior to the forming of the recess, to define a new mounting surface that is closer to the surface of each conductive feature. The removing of the thickness of the second overmold can include a grinding operation such that the new mounting surface of the second overmold is substantially planar.

In some embodiments, the removing of a portion of the second overmold can include performing a laser operation to form the recess to expose the surface of each conductive feature.

In some embodiments, the providing of the solderable material layer can include partially or fully filling the recess with the solderable material layer. The solderable material layer can partially fill the recess such that an exposed surface of the solderable material layer and the mounting surface of the second overmold define a shallow recess. The solderable material layer can fully fill the recess such that an exposed surface of the solderable material layer is substantially coplanar with or protrudes beyond the mounting surface of the second overmold.

In some embodiments, the method can further include forming a shielding layer or a shielding feature to provide a shielding functionality for the packaged module.

In some embodiments, the mounting of the second component and implementing of the plurality of conductive features on the second side of the packaging substrate can be performed after the forming of the first overmold on the first side of the packaging substrate. In some embodiments, the mounting of the first component on the first side of the packaging substrate can be performed after the forming of the second overmold on the second side of the packaging substrate.

In some teachings, the present disclosure relates to a method for fabricating a packaged module. The method includes forming or providing a packaging substrate having a non-mounting side and a mounting side, with the packaging substrate including a plurality of conductive features on the mounting side of the packaging substrate to provide electrical connections for the packaged module. The conductive features are formed from conductive material having a sufficiently high melting temperature so that the conductive features do not melt during a mounting operation. The method further includes mounting a component on the mounting side of the packaging substrate, forming an overmold on the mounting side of the packaging substrate, mounting a component on the non-mounting side of the packaging substrate, and forming an overmold on the non-mounting side of the packaging substrate. The method further includes removing a portion of the overmold on the mounting side to expose a surface for each conductive feature, and providing a solderable material layer dimensioned to cover the surface of each conductive feature.

In some implementations, the present disclosure relates to a packaged module that includes a packaging substrate having a first side and a second side, an overmold implemented on the second side of the packaging substrate, with the overmold defining a mounting surface to allow mounting of the packaged module on a circuit board, and a plurality of conductive features implemented on the second side of the packaging substrate to provide electrical connections for the packaged module. The conductive features are formed from conductive material that does not melt during a mounting operation. Each conductive feature has a surface that is substantially coplanar with or recessed with respect to the mounting surface. The packaged module further includes a solderable material layer dimensioned to cover the surface of each conductive feature.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 7A to 7G show an example of a process that can be implemented to fabricate one or more of the packaged modules of FIG. 5A.

FIGS. 9A to 9J show yet another example of a process that can be implemented to fabricate one or more of the packaged modules of FIG. 5A.

DETAILED DESCRIPTION OF SOME EMBODIMENTS

The headings provided herein, if any, are for convenience only and do not necessarily affect the scope or meaning of the claimed invention.

In many electronics applications including radio-frequency (RF) applications, integrated circuits and/or circuit elements are implemented as parts of packaged modules. A packaged module typically includes a packaging substrate configured to receive and support a plurality of components such as semiconductor die and/or circuit elements such as discrete passive components. Some or all of such components can be mounted on an upper side of the packaging substrate, and an upper overmold can be provided to encapsulate such components.

In some embodiments, a lower side of the packaging substrate is configured to allow mounting of the packaged module onto a circuit board. For example, an array of solder balls can be provided on the lower side of the packaging substrate to allow the packaged module to be secured to the circuit board and to provide electrical connections for the packaged module.

In some embodiments, one or more lower side components such as one or more die can be mounted on the lower side of the packaging substrate. To accommodate such lower side component(s), the array of solder balls (also referred to as a ball grid array, or BGA) can be arranged to provide an appropriate amount of space for the lower side component(s).

In some embodiments, a second overmold structure can be provided on the lower side of a packaging substrate of a packaged module. Among others, U.S. Pat. No. 10,361,145 titled THROUGH-MOLD OPENINGS FOR DUAL-SIDED PACKAGED MODULES WITH BALL GRID ARRAYS, which is expressly incorporated by reference in its entirely, and its disclosure is to be considered part of the specification of the present application, describes such a lower side overmold that can encapsulate one or more lower side components while allowing solder balls to provide mounting and electrical-connection functionalities for the packaged module.

Figure 1:
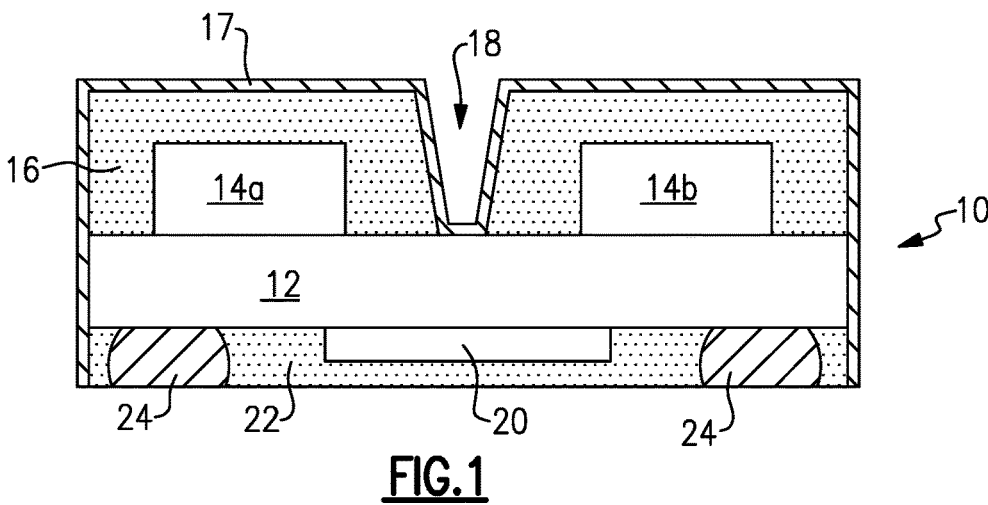
FIG. 1 shows an example of a packaged module having solder balls and a lower side overmold implemented on the lower side of a packaging substrate such that the solder balls are substantially encapsulated within the overmold with a lower side surface of each solder ball being exposed to allow mounting of the packaged module on a circuit board.

FIG. 1 shows an example of a packaged module 10 having solder balls 24 and a lower side overmold 22 implemented on the lower side of a packaging substrate 12 such that the solder balls 24 are substantially encapsulated within the overmold 22 with a lower side surface of each solder ball 24 being exposed to allow mounting of the packaged module 10 on a circuit board. In the example of FIG. 1, a plurality of components 14a, 14b are shown to be mounted on the upper side of the packaging substrate 12, and a lower side component 20 mounted on the lower side of the packaging substrate 12. Further, an upper overmold 16 is shown to encapsulate the components 14a, 14b, and a shielding layer 17 is shown to cover substantially all of the upper portion of the upper overmold 16 and the sides of the packaged module 10. In some embodiments, one or more through-mold vias 18 can be implemented to provide shielding between, for example, the two regions of the upper side of the packaging substrate 12 (e.g., between the first and second upper side components 14a, 14b).

Figure 2:
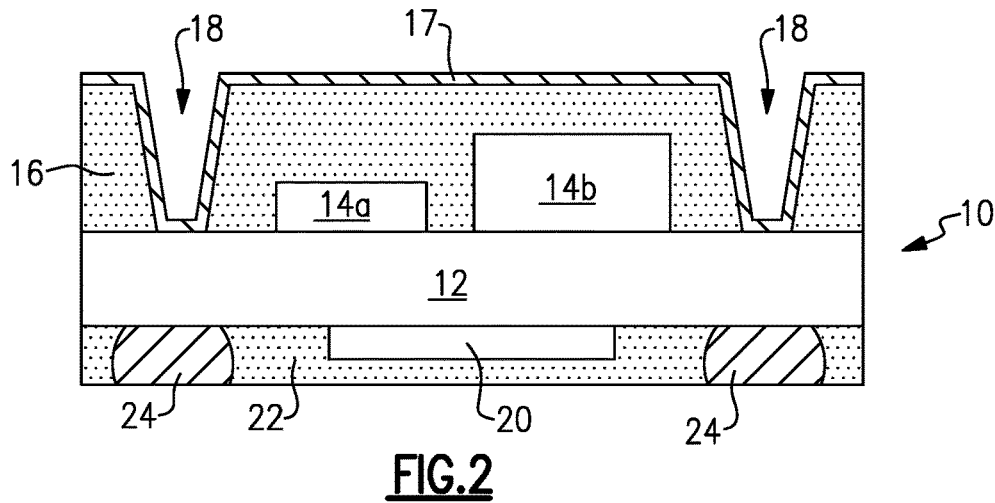
FIG. 2 shows another example of a packaged module having solder balls and a lower side overmold implemented on the lower side of a packaging substrate such that the solder balls are substantially encapsulated within the overmold with a lower side surface of each solder ball being exposed to allow mounting of the packaged module on a circuit board.

FIG. 2 shows another example of a packaged module 10 having solder balls 24 and a lower side overmold 22 implemented on the lower side of a packaging substrate 12 such that the solder balls 24 are substantially encapsulated within the overmold 22 with a lower side surface of each solder ball 24 being exposed to allow mounting of the packaged module 10 on a circuit board. In the example of FIG. 2, a plurality of components 14a, 14b are shown to be mounted on the upper side of the packaging substrate 12, and a lower side component 20 mounted on the lower side of the packaging substrate 12. Further, an upper overmold 16 is shown to encapsulate the components 14a, 14b, and a shielding layer 17 is shown to cover substantially all of the upper portion of the upper overmold 16 but not the sides of the packaged module 10. In some embodiments, one or more through-mold vias 18 can be implemented to provide shielding between, for example, a region on the upper side of the packaging substrate 12 and a region external to the packaged module 10 (e.g., between a region where the components 14a, 14b are located and an external region).

It is noted that in some situations, solder balls such as the example solder balls 24 of FIGS. 1 and 2 can become partially or fully liquified during a reflow process, if the reflow process involves a sufficiently high temperature compared to a melting temperature of the solder balls. Such liquification can result in a change in shape of one or more solder balls, thereby imposing position restrictions/limitations during a mounting process.

Figure 3:
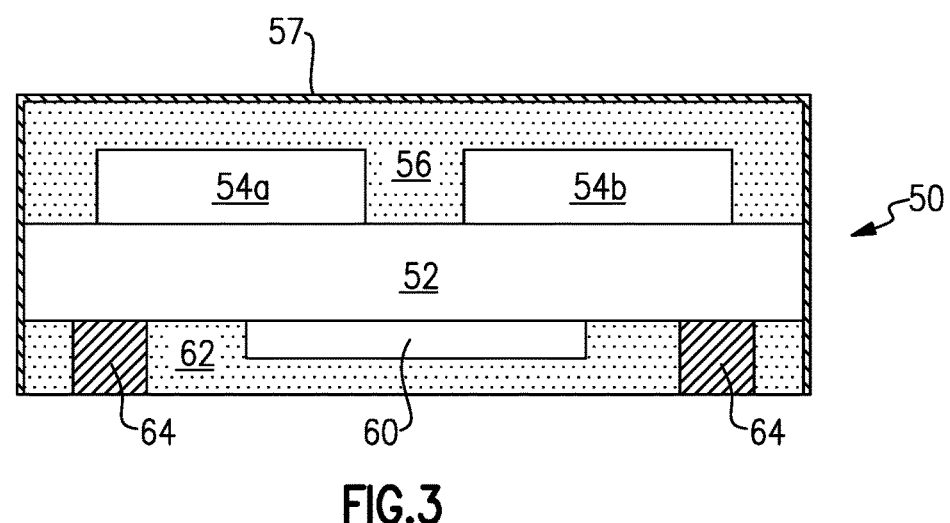
FIG. 3 shows a packaged module having components mounted on an upper side of a packaging substrate and encapsulated by an upper overmold, and a component mounted on a lower side of the packaging substrate and encapsulated by a lower overmold.

In some embodiments, a packaged module can be implemented so that solder balls are replaced with conductive structures such as metal posts that do not change shape during a high temperature reflow process. For example, FIG. 3 shows a packaged module 50 having components 54a, 54b mounted on an upper side of a packaging substrate 52 and encapsulated by an upper overmold 56, and a component 60 mounted on a lower side of the packaging substrate 52 and encapsulated by a lower overmold 62. A shielding layer 57 is shown to be provided to substantially cover the upper surface of the overmold 56 and the sides of the packaged module 50.

FIG. 3 shows that in some embodiments, a plurality of conductive features 64 can be provided on the lower side of the packaging substrate 52 to allow the package module 50 to be secured to a circuit board and to provide electrical connections for the packaged module 50. Such conductive features can be, for example, metal posts that do not change shape during a high temperature reflow process, thereby allowing the package module 50 to be mounted on the circuit board without having additional position restrictions/limitations being imposed due to liquification of the metal posts 64.

It is noted that in the example implementation of FIG. 3, the mounting portion (e.g., the bottom surface) of the metal posts 64 can be obtained by, for example, forming a lower overmold to cover a plurality of metal posts secured to the packaging substrate 52, followed by a removal process (e.g., a grinding process) to remove a portion of the lower overmold and portions of the metal posts. In such a configuration, use of some metal posts, such as copper posts, can be challenging since the exposed surface of each copper post (e.g., on the bottom of each post) can oxidize (e.g., if exposed to air for a sufficient length of time) prior to or during a mounting operation.

In some embodiments, the exposed surfaces of the copper posts can be electrolytically plated with a solderable material to protect the copper post surface from oxidation. However, such an electrolytical plating operation can be difficulty and/or costly.

In some embodiments, a packaged module can include a packaging substrate having a first side (e.g., an upper side where oriented to be mounted on a circuit board) and a second side (e.g., a lower side where oriented to be mounted on the circuit board). One or more components can be mounted on the first side of the packaging substrate, and one or more components can be mounted on the second side of the packaging substrate. A first overmold can be implemented on the first side of the packaging substrate to encapsulate the one or more components mounted thereon, and a second overmold can be implemented on the second side of the packaging substrate to encapsulate the one or more components mounted thereon.

In some embodiments, the foregoing packaged module can further include a plurality of conductive features such as columns, posts or pedestals, and such conductive features can be formed from conductive material having a sufficiently high melting temperature so that the conductive features do not partially or fully melt during a mounting operation where the packaged module is mounted on a circuit board. Such conductive material can include a metal, such as copper, that is susceptible to oxidation of an exposed surface.

In some embodiments, each of the conductive features can include a surface that is substantially coplanar with or recessed with respect to a mounting surface defined by the second overmold. The surface of each conductive feature can be substantially covered by a solderable material to prevent or reduce the likelihood of oxidation of the surface prior to and/or during the mounting operation.

Figures 4A, 4B:
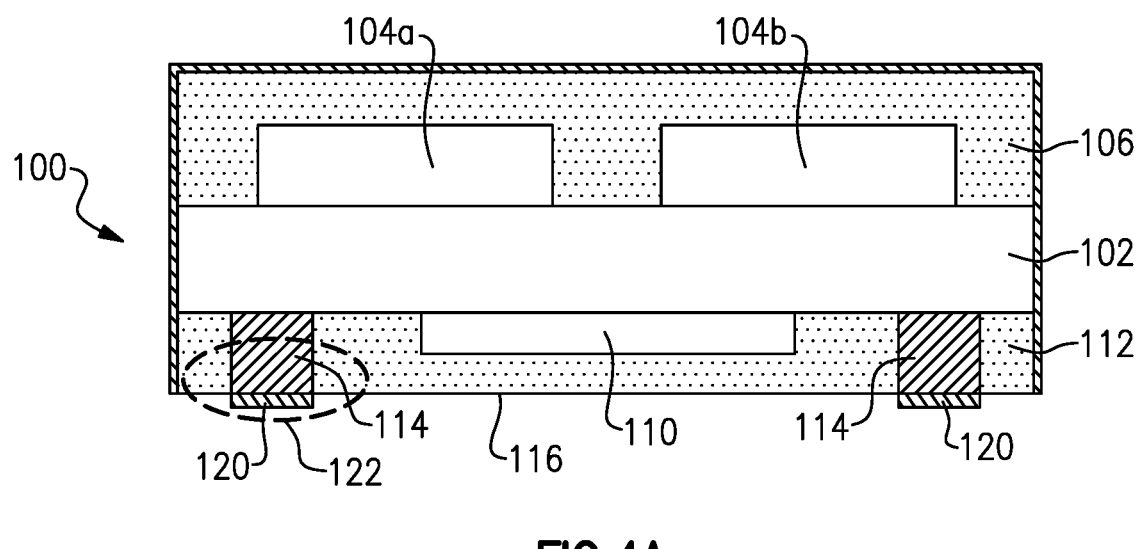
FIG. 4A shows an example of a packaged module that includes a packaging substrate with components mounted on an upper side and a component mounted on a lower side, a first overmold implemented on the upper side and a second overmold implemented on the lower side, a plurality of conductive features with each having an end being at or near a lower surface of the second overmold, and a solderable material layer that substantially covers the end of each conductive feature.
FIG. 4B shows an enlarged view of a portion of FIG. 4A.

In some embodiments, the solderable material covering the surface of each conductive feature can be implemented for the configuration where the surface of each conductive feature is substantially coplanar with the mounting surface of the second overmold, as a patterned layer that protrudes beyond the mounting surface of the second overmold and having a lateral dimension that extends beyond a lateral edge of the conductive feature. In some embodiments, such a solderable material can include a solder applied by, for example, a printing process. FIG. 4A shows an example of such a packaged module (100), and FIG. 4B shows an enlarged view of a portion of FIG. 4A indicated as 122.

Figure 5A:
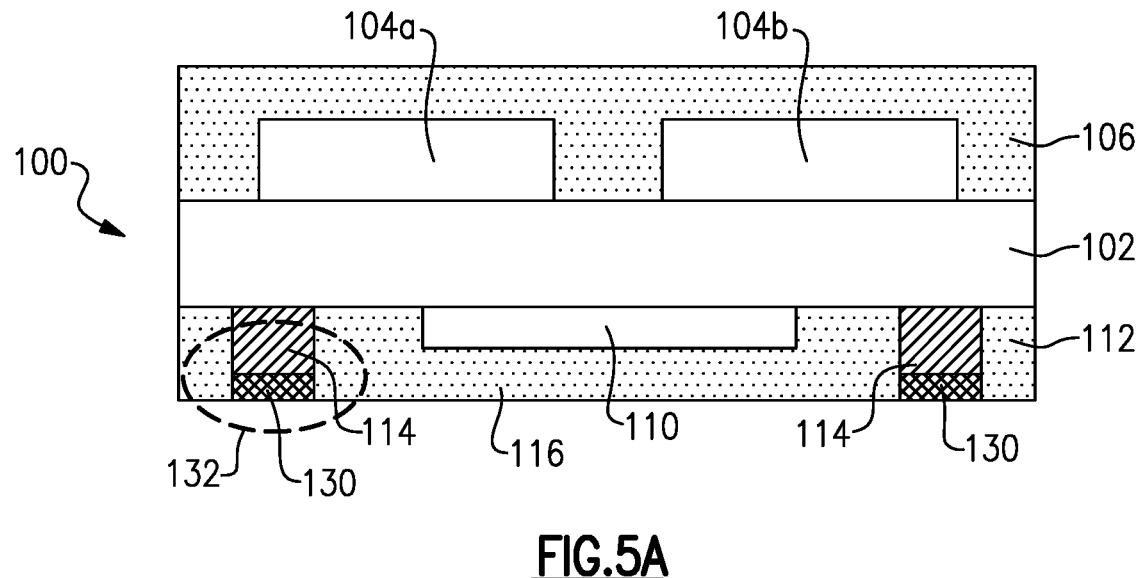
FIG. 5A shows another example of a packaged module that includes a packaging substrate with components mounted on an upper side and a component mounted on a lower side, a first overmold implemented on the upper side and a second overmold implemented on the lower side, a plurality of conductive features with each having an end being recessed from a lower surface of the second overmold, and a solderable material layer that substantially covers the end of each conductive feature.
Figure 5B:
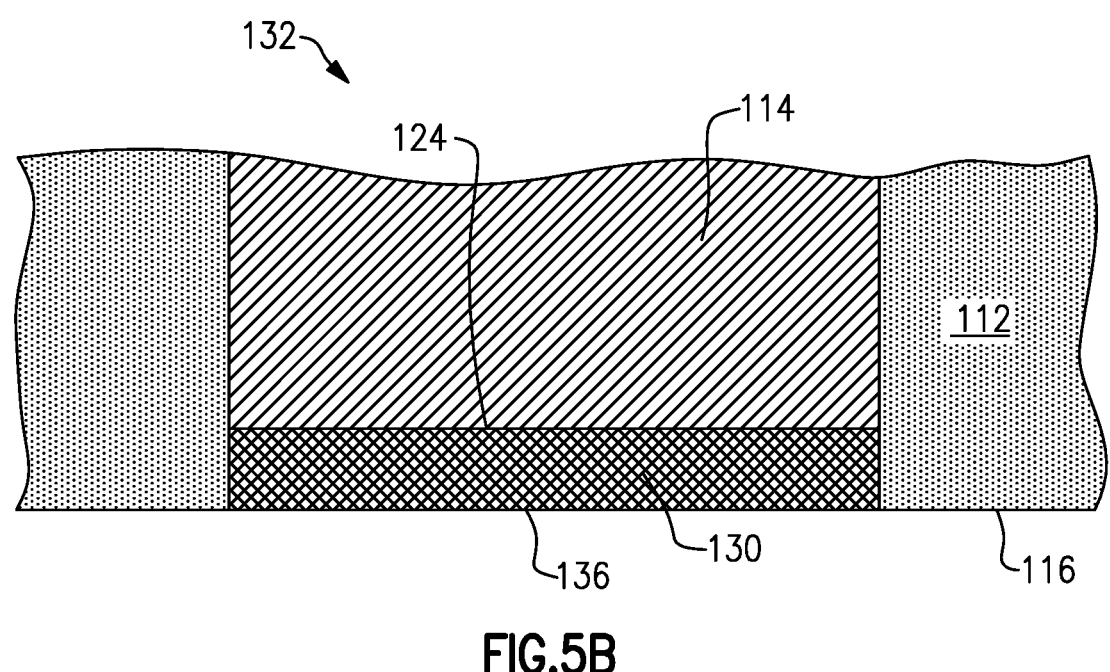
FIG. 5B shows an enlarged view of a portion of FIG. 5A.

In some embodiments, the solderable material covering the surface of each conductive feature can be implemented for the configuration where the surface of each conductive feature is recessed with respect to the mounting surface of the second overmold, as a layer that is partially or fully within a recess defined by the surface of the conductive feature and the mounting surface of the second overmold so as to substantially cover the surface of the conductive feature. In some embodiments, the solderable material cover can have an exposed surface that is at least within the recess, substantially parallel with the mounting surface of the second overmold, or protruding at least partially beyond the mounting surface of the second overmold. FIG. 5A shows an example of such a packaged module (100), and FIG. 5B shows an enlarged view of a portion of FIG. 5A indicated as 132.

Referring to the examples of FIGS. 4 and 5, each packaged module 100 is shown to include a packaging substrate 102 having a first side (e.g., an upper side when oriented as shown) and a second side (e.g., a lower side), with example components 104a, 104b mounted on the upper side and an example component 110 mounted on the lower side. A first overmold 106 is shown to be implemented on the upper side of the packaging substrate 102 so as to encapsulate the components 104a, 104b, and a second overmold 112 is shown to be implemented on the lower side of the packaging substrate 102, thereby forming a dual-sided module.

Each packaged module 100 of FIGS. 4 and 5 is shown to further include a plurality of conductive features 114 such as posts, with each having one end attached to the lower side of the respective packaging substrate 102, and the other end being at or near a lower surface 116 of the second overmold 112. Such a lower surface of the second overmold 112 is also referred to herein as a mounting surface of the packaged module 100.

In the example of FIGS. 4A and 4B, the packaged module 100 is shown to be configured so that each conductive post 114 includes a surface (124 in FIG. 4B) that is substantially coplanar with respect to the mounting surface 116. The surface 124 of each conductive post 114 is shown to be substantially covered by a solderable material layer 120 to prevent or reduce the likelihood of oxidation of the surface 124 prior to and/or during a mounting operation.

FIGS. 4A and 4B shows that in some embodiments, the solderable material layer 120 covering the surface of each conductive post 114 can be implemented as a patterned layer that protrudes beyond the mounting surface 116, and can have a lateral dimension such that an outer edge of the solderable material layer 120 is within, approximately at, or extends beyond a lateral boundary of the conductive post 114. In the enlarged view of FIG. 4B, the solderable material layer 120 is shown to have a lateral outer edge that is approximately at the lateral boundary of the conductive post 114. It is noted that when the assembly of FIGS. 4A and 4B is subjected to an elevated temperature, the solderable material layer 120 will likely re-form into a bump-like structure. Such a bump-like structure can cover some or all of the surface 124 of the respective conductive post 114. Examples related to a fabrication process that can be utilized to form the packaged module of FIGS. 4A and 4B are described herein in greater detail.

In the example of FIGS. 5A and 5B, the packaged module 100 is shown to be configured so that each conductive post 114 includes a surface (124 in FIG. 5B) that is recessed with respect to the mounting surface 116. The surface 124 of each conductive post 114 is shown to be substantially covered by a solderable material layer 130 to prevent or reduce the likelihood of oxidation of the surface 124 prior to and/or during a mounting operation.

FIGS. 5A and 5B shows that in some embodiments, the solderable material layer 130 covering the surface 124 of each conductive post 114 is shown to include an exposed surface (136 in FIG. 5B). In some embodiments, the solderable material layer 130 can be dimensioned such that the exposed surface 136 is at least partially within the recess, substantially parallel with the mounting surface 116, or at least partially protruding beyond the mounting surface 116. In the last example configuration, an outer edge of the solderable material layer 130 may or may not extend laterally beyond a lateral boundary of the recess. Examples related to a fabrication process that can be utilized to form the packaged module of FIGS. 5A and 5B are described herein in greater detail.

In the example of FIGS. 5A and 5B, the lateral dimension of the conductive post 114 is depicted as being approximately the same as the lateral dimension of the recess occupied by the solderable material layer 130. However, it will be understood that in some embodiments, the lateral dimension of the recess occupied by the solderable material layer 130 can be different than the lateral dimension of the corresponding conductive post 114.

Figure 5C:
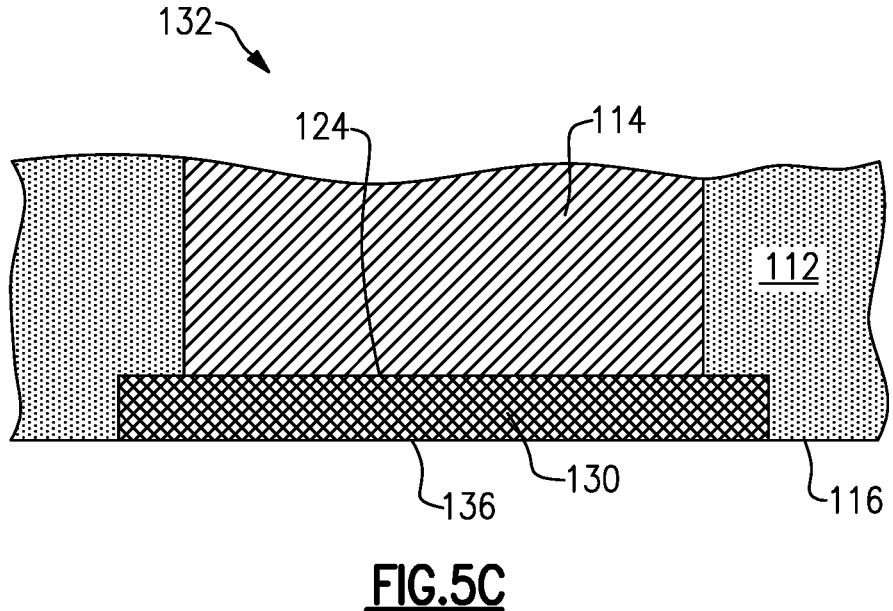
FIG. 5C shows an example where the lateral dimension of the recess occupied by the solderable material layer is greater than the lateral dimension of the conductive feature.
Figure 5D:
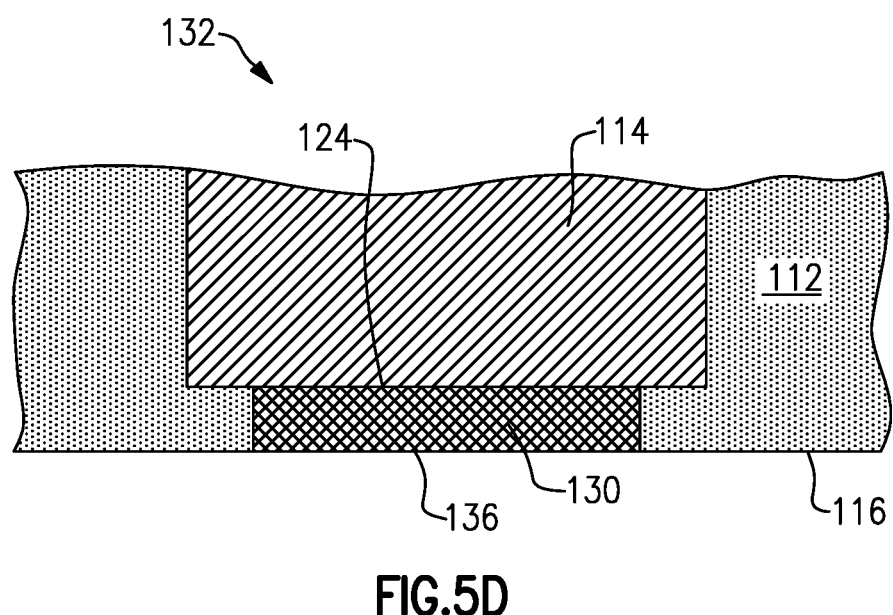
FIG. 5D shows an example where the lateral dimension of the recess occupied by the solderable material layer is less than the lateral dimension of the conductive feature.

For example, FIG. 5C shows an example where the lateral dimension of the recess occupied by the solderable material layer 130 is greater than the lateral dimension of the conductive post 114. In another example, FIG. 5D shows an example where the lateral dimension of the recess occupied by the solderable material layer 130 is less than the lateral dimension of the conductive post 114.

It is noted that in the example of FIG. 4A, the packaged module 100 is depicted as including a shielding layer that covers substantially all of the upper surface of the first overmold 106 and the sides of the packaged module 100. In the example of FIG. 5A, however, the packaged module 100 is depicted as not including a shielding layer. Accordingly, it will be understood that a packaged module having one or more features as described herein can be implemented with or without shielding functionality. For embodiments with shielding functionality, a shield can be implemented in a number of ways, including the shielding examples of FIGS. 1, 2, 3 and 4A. In the context of shielding examples where one or more electrical connections are provided between a surface of a packaging substrate and a surface of an overmold (e.g., such as the through-mold via(s) in the examples of FIGS. 1 and 2), it will be understood that such electrical connection(s) can also be provided with other conductive features such as wire(s), post(s), etc.

FIGS. 6A to 6F show an example of a process that can be implemented to fabricate one or more of the packaged modules 100 of FIG. 4A. Although the example process is described in the context of an array format where a plurality of units are processed while attached in an array followed by a singulation step, it will be understood that a packaged module having one or more features as described herein can also be fabricated as a separate individual unit.

Figures 6A, 6B, 6C:
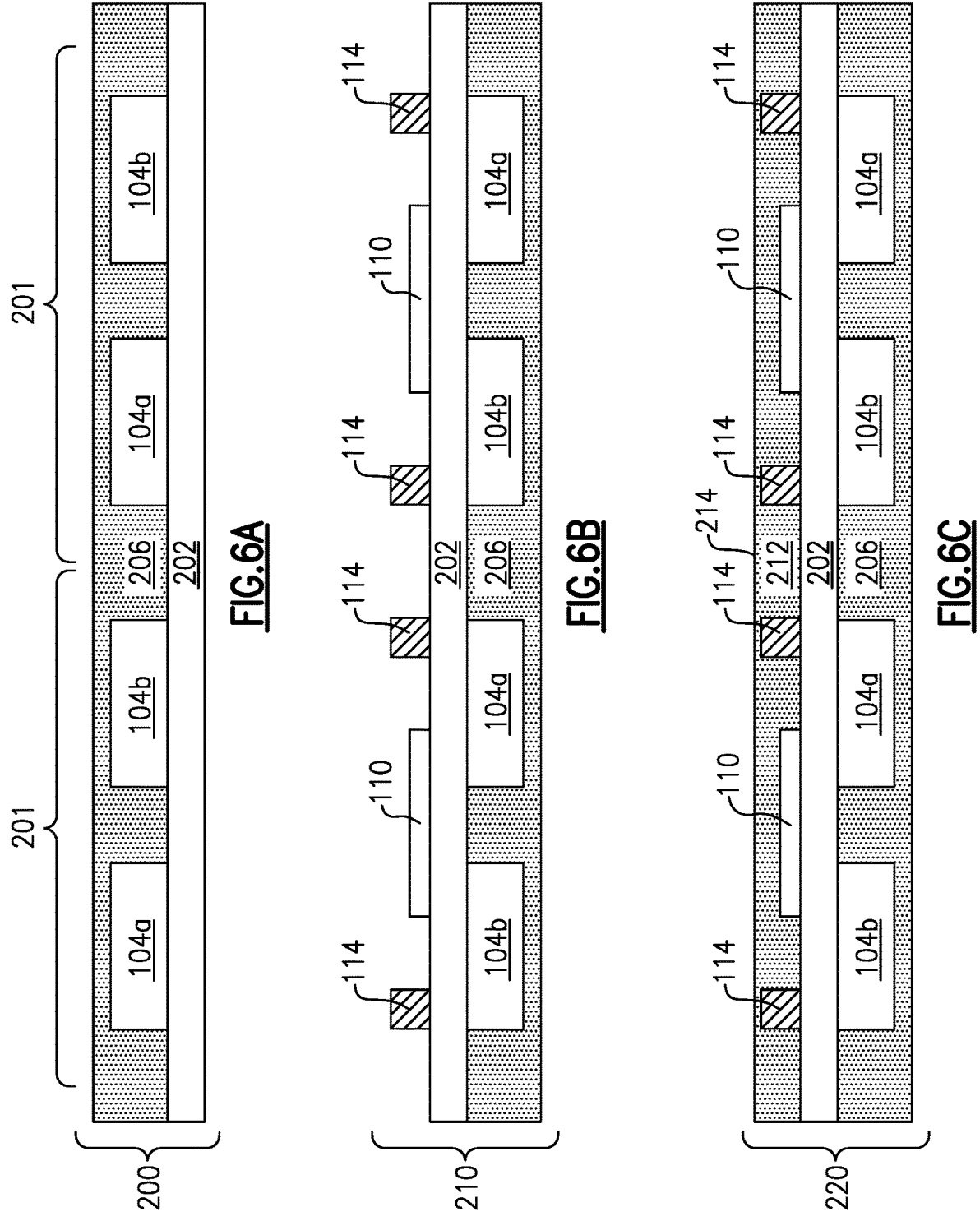
FIGS. 6A to 6F show an example of a process that can be implemented to fabricate one or more of the packaged modules of FIG. 4A.

FIG. 6A shows a process step where an assembly 200 can be provided or formed. More particularly, the assembly 200 is shown to include a packaging substrate panel 202 having a plurality of units 201, where each unit will become an individual packaged module upon completion of the fabrication process. Each unit 201 is shown to include example upper side components 104a, 104b, and a first overmold 206 is shown to cover each of the units 201 on the upper side of the packaging substrate panel 202. In some embodiments, the first overmold 206 at this stage can be a contiguous structure that encapsulates substantially the entire upper side of the packaging substrate panel 202.

FIG. 6B shows a process step where the assembly 200 of FIG. 6A can be further processed to mount a lower side component 110 and a plurality of conductive posts 114 for each unit (201 in FIG. 6A) on the lower side of the packaging substrate panel 202, so as to form an assembly 210. It is noted that in some embodiments, a packaging substrate panel may be provided with pre-formed conductive posts. Examples related to processing of such a packaging substrate are described herein in greater detail.

FIG. 6C shows a process step where the assembly 210 of FIG. 6B can be further processed to form a second overmold 212 that covers each of the units on the lower side of the packaging substrate panel 202, so as to form an assembly 220. Such a second overmold is shown to define an overmold surface 214. In some embodiments, the second overmold 212 at this stage can be a contiguous structure that encapsulates substantially the entire lower side of the packaging substrate panel 202.

Figures 6D, 6E, 6F:
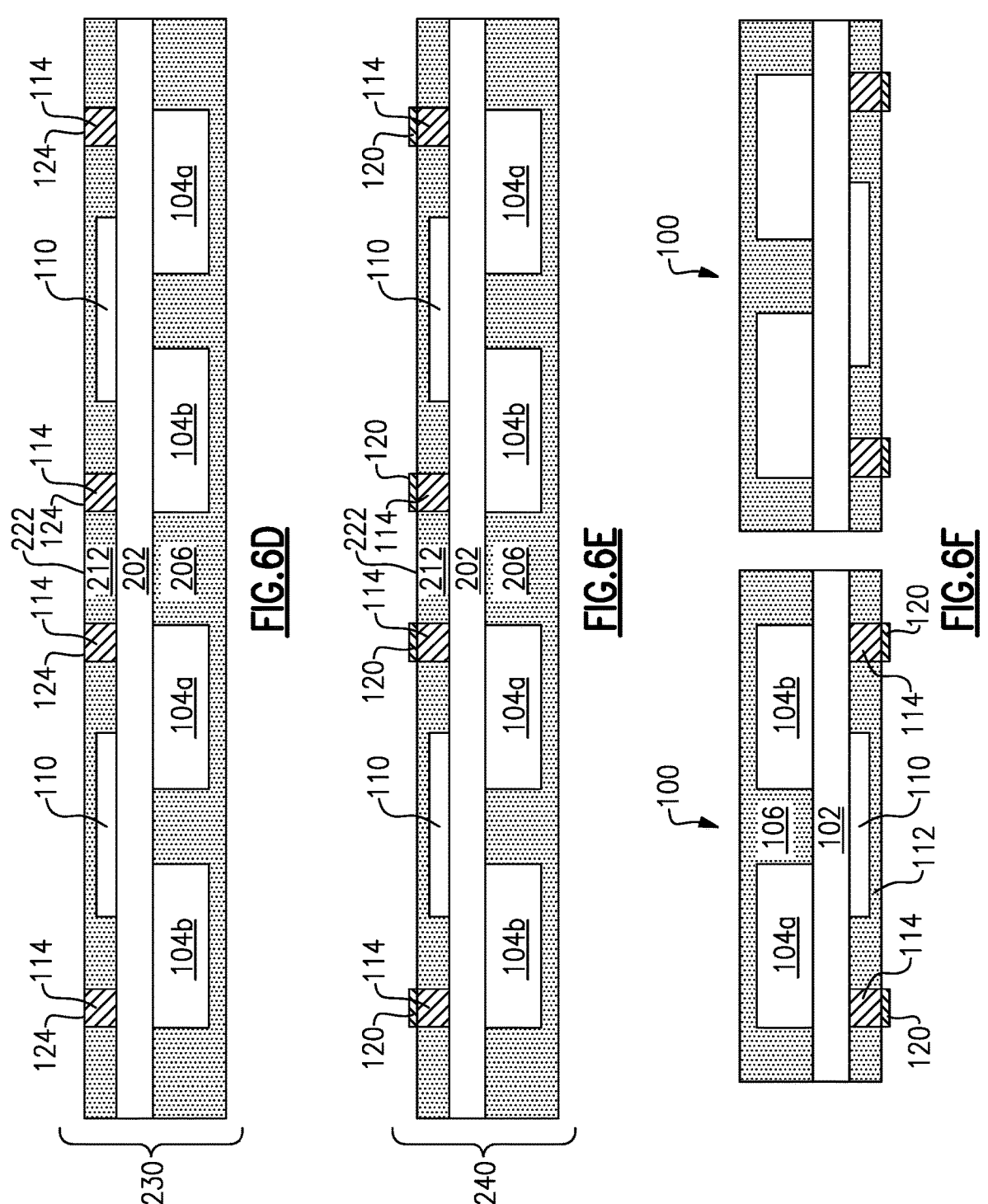

FIG. 6D shows a process step where the assembly 220 of FIG. 6C can be further processed to remove a portion of the second overmold 212 to form a new overmold surface 222 that exposes a portion 124 of each conductive post 114, so as to form an assembly 230. In some embodiments, such a removal process can be achieved by, for example, a grinding process.

In some embodiments, a deep cleaning step can be implemented to clean the overmold surface 222 to remove oxidation that may have formed on the exposed surface 124 of each conductive post 114. Following such a cleaning step, a process step of FIG. 6E can be implemented, where a solderable material layer 120 is formed to cover the surface 124 of each conductive post 114, so as to form an assembly 240. In some embodiments, the solderable material layer 120 covering the surface of each conductive post 114 can be implemented as a patterned layer that protrudes beyond the overmold surface 222, and can have a lateral dimension as described herein in reference to FIGS. 4A and 4B.

FIG. 6F shows a process step where the assembly 240 of FIG. 6E can be further processed to singulate the units into a plurality of individual units 100. As shown in FIG. 6F, each individual unit 100 is similar to the example packaged module 100 of FIG. 4A. It is noted that in some embodiments, the individual unit 100 of FIG. 6F may or may not be processed further to form a shielding layer similar to the example of FIG. 4A.

FIGS. 7A to 7G show an example of a process that can be implemented to fabricate one or more of the packaged modules 100 of FIG. 5A. Although the example process is described in the context of an array format where a plurality of units are processed while attached in an array followed by a singulation step, it will be understood that a packaged module having one or more features as described herein can also be fabricated as a separate individual unit.

FIG. 7A shows a process step where an assembly 300 can be provided or formed. More particularly, the assembly 300 is shown to include a packaging substrate panel 302 having a plurality of units 301, where each unit will become an individual packaged module upon completion of the fabrication process. Each unit 301 is shown to include example upper side components 104a, 104b, and a first overmold 306 is shown to cover each of the units 301 on the upper side of the packaging substrate panel 302. In some embodiments, the first overmold 306 at this stage can be a contiguous structure that encapsulates substantially the entire upper side of the packaging substrate panel 302.

FIG. 7B shows a process step where the assembly 300 of FIG. 7A can be further processed to mount a lower side component 110 and a plurality of conductive posts 114 for each unit (301 in FIG. 7A) on the lower side of the packaging substrate panel 302, so as to form an assembly 310.

FIG. 7C shows a process step where the assembly 310 of FIG. 7B can be further processed to form a second overmold 312 that covers each of the units on the lower side of the packaging substrate panel 302, so as to form an assembly 320. Such a second overmold is shown to define an overmold surface 314. In some embodiments, the second overmold 312 at this stage can be a contiguous structure that encapsulates substantially the entire lower side of the packaging substrate panel 302. It is noted that at this stage, each of the conductive posts 114 is encapsulated by the second overmold 312.

FIG. 7D shows a process step where the assembly 320 of FIG. 7C can be further processed to remove a portion of the second overmold 312 to form a new overmold surface 322, so as to form an assembly 330. In some embodiments, such a removal process can be achieved by, for example, a grinding process. It is noted that at this stage, each of the conductive posts 114 remains encapsulated by the second overmold 312 at a shallower depth from the new overmold surface 322.

FIG. 7E shows a process step where the assembly 330 of FIG. 7D can be further processed to form a recess 332 that exposes a surface 124 of each conductive post 114. In some embodiments, such a recess can have a lateral dimension that is less than, equal to or greater than the lateral dimension of the respective conductive post 114. Accordingly, the exposed surface 124 of the conductive post 114 resulting from the formation of the recess 332 can correspond to some or all of the end surface of the conductive post 114. In some embodiments, the formation of the recesses 332 corresponding to the conductive posts 114 can be achieved by, for example, a laser operation to remove respective portions of the second overmold 312.

In some embodiments, a deep cleaning step can be implemented to clean the overmold surface 322, including the recesses 332, to remove oxidation that may have formed on the exposed surface 124 of each conductive post 114. Following such a cleaning step, a process step of FIG. 7F can be implemented, where a solderable material layer 130 is formed to cover the surface 124 of each conductive post 114, so as to form an assembly 350. In some embodiments, the solderable material layer 130 covering the surface of each conductive post 114 can be implemented to partially or completely fill the respective recess (332 in FIG. 7E). In some embodiments, the solderable material layer 130 can have an exposed surface that is within the recess 332, substantially coplanar with the overmold surface (322 in FIG. 7D), or protruding beyond the overmold surface 322.

FIG. 7G shows a process step where the assembly 350 of FIG. 7F can be further processed to singulate the units into a plurality of individual units 100. As shown in FIG. 7G, each individual unit 100 is similar to the example packaged module 100 of FIG. 5A. It is noted that in some embodiments, the individual unit 100 of FIG. 7G may or may not be processed further to form a shielding layer.

FIGS. 8A to 8D show another example of a process that can be implemented to fabricate one or more of the packaged modules 100 of FIG. 5A. Although the example process is described in the context of an array format where a plurality of units are processed while attached in an array followed by a singulation step, it will be understood that a packaged module having one or more features as described herein can also be fabricated as a separate individual unit.

Figures 8A, 8B, 8C, 8D:
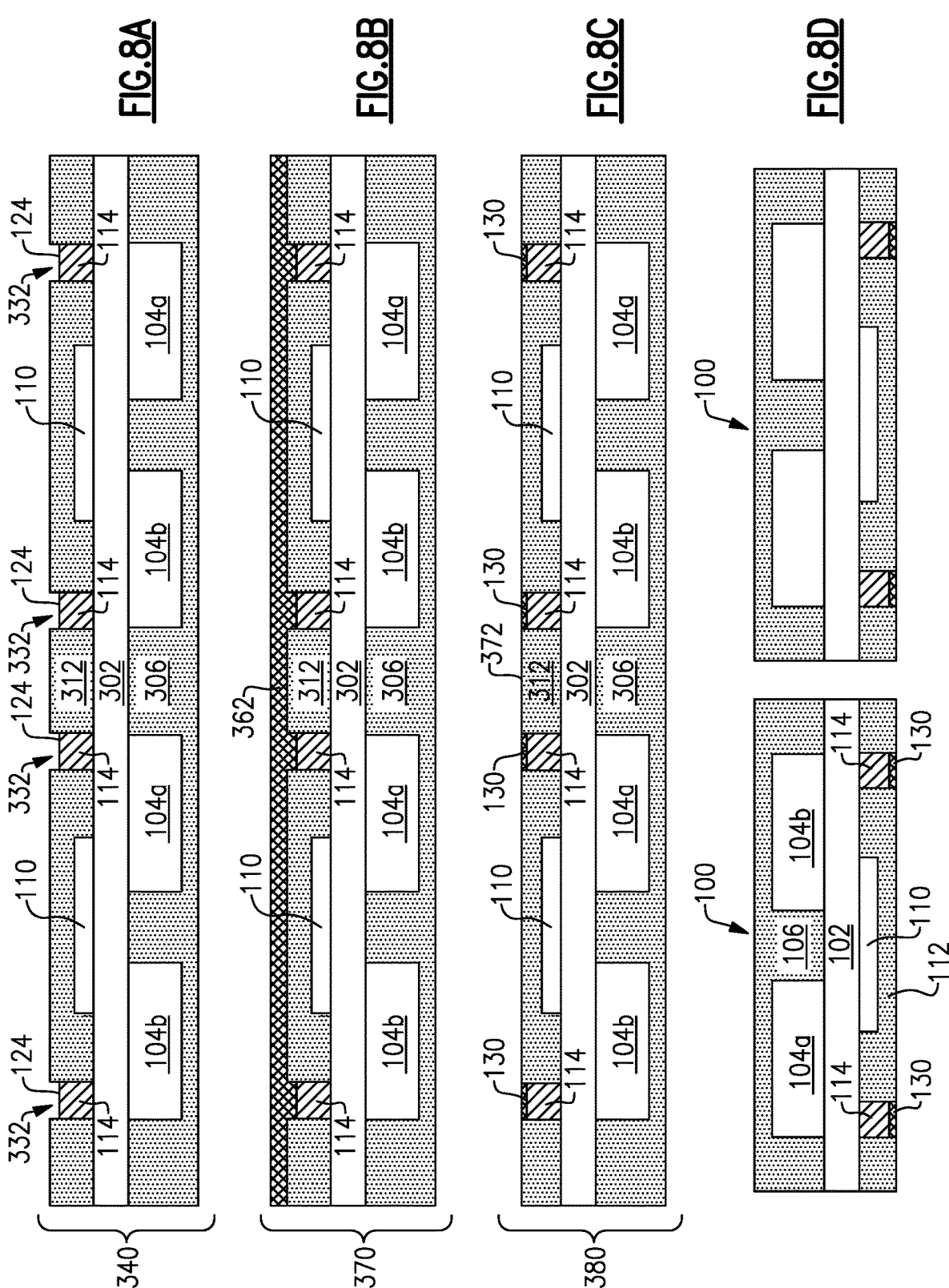
FIGS. 8A to 8D show another example of a process that can be implemented to fabricate one or more of the packaged modules of FIG. 5A.

FIG. 8A shows an assembly 340 that can be formed similar to the assembly 340 of FIG. 7E. Accordingly, in some embodiments, such an assembly can be formed as described herein in reference to FIGS. 7A to 7E.

FIG. 8B shows a process step where the assembly 340 of FIG. 8A can be further processed to form a layer of solderable material 362 that covers the exposed side of the second overmold 312 and the recesses 332 formed thereon, so as to form an assembly 370. In some embodiments, such a layer of solderable material can be formed by, for example, a sputtering process.

FIG. 8C shows a process step where the assembly 370 of FIG. 8B can be further processed to remove the solderable material (362 in FIG. 8B) to form a new overmold surface 372 while maintaining some or all of the solderable material within the recesses such that a solderable material layer 130 maintains coverage of the conductive posts 114, so as to form an assembly 380. In some embodiments, such a removal of the solderable material can include removal of some of the second overmold 312 to form the overmold surface 372. In some embodiments, such a removal process can be achieved by, for example, a grinding process. In some embodiments, the removal process can result in the overmold surface 372 being substantially coplanar with the exposed surface of the solderable material layer 130 that covers each conductive post 114.

FIG. 8D shows a process step where the assembly 380 of FIG. 8C can be further processed to singulate the units into a plurality of individual units 100. As shown in FIG. 8D, each individual unit 100 is similar to the example packaged module 100 of FIG. 5A. It is noted that in some embodiments, the individual unit 100 of FIG. 8D may or may not be processed further to form a shielding layer.

In various examples described herein, the first side of a packaging substrate is assumed to be a non-mounting side (e.g., upper side if the corresponding module is mounted on its lower side) and the second side of the packaging substrate is assumed to be a mounting side. In the process examples of FIGS. 6 and 7, each process is described as beginning with a process step (e.g., FIG. 6A or FIG. 7A) where the first side of the packaging substrate (202 in FIG. 6A or 302 in FIG. 7A) is processed by mounting of upper side components 104a, 104b and formation of a first overmold (206 or 306).

It will be understood that in some embodiments, a process can be implemented to fabricate one or more of the packaged modules, where the mounting side (second side) of a packaging substrate is processed first. For example, the mounting side of a packaging substrate may be provided with features (plating for mounting of conductive posts, or pre-formed conductive posts) thereby resulting in a non-flat surface which is undesirable when processing the other side of the packaging substrate.

FIGS. 9A to 9J show an example of a process that can be implemented to fabricate one or more of the packaged modules 100 of FIG. 5A, where a mounting side of a packaging substrate is processed first. Although the example process is described in the context of an array format where a plurality of units are processed while attached in an array followed by a singulation step, it will be understood that a packaged module having one or more features as described herein can also be fabricated as a separate individual unit.

FIG. 9A shows a process step where an assembly 400 can be provided or formed. More particularly, the assembly 400 is shown to include a packaging substrate panel 402 having a plurality of units 401, where each unit will become an individual packaged module upon completion of the fabrication process. Each unit 401 is shown to include conductive posts 114 mounted on the mounting side of the packaging substrate 402. In some embodiments, such conductive posts can be pre-formed as supplied, or be mounted on plating features utilizing, for example an SMT process.

FIG. 9B shows a process step where the assembly 400 of FIG. 9A can be further processed to mount a lower side component 110 on the mounting side of the packaging substrate panel 402, so as to form an assembly 410.

FIG. 9C shows a process step where the assembly 410 of FIG. 9B can be further processed to form an overmold 412 that covers each of the units on the mounting side of the packaging substrate panel 402, so as to form an assembly 420. Such an overmold is shown to define an overmold surface 414. In some embodiments, the overmold 412 at this stage can be a contiguous structure that encapsulates substantially the entire mounting side of the packaging substrate panel 402. It is noted that at this stage, each of the conductive posts 114 is encapsulated by the overmold 412.

FIG. 9D shows a process step where the assembly 420 of FIG. 9C can be further processed to remove a portion of the overmold 412 to form a new overmold surface 422, so as to form an assembly 430. In some embodiments, such a removal process can be achieved by, for example, a grinding process. It is noted that at this stage, each of the conductive posts 114 remains encapsulated by the overmold 412 at a shallower depth from the new overmold surface 422. It is also noted that the new overmold surface 422 resulting from the removal process can be achieved to provide a desirable thickness of the assembly 430 to, for example, provide better tolerance control during subsequent processing steps.

FIG. 9E shows a process step where the assembly 430 of FIG. 9D is inverted to allow further processing on the non-mounting side of the packaging substrate 402. Such a non-mounting side of the packaging substrate 402 is shown to include a substrate surface 432.

FIG. 9F shows a process step where the assembly 430 of FIG. 9E can be further processed. More particularly, upper side components 104*a*, 104*b* can be mounted for each unit (401 in FIG. 9A) on the surface 432 of the non-mounting side of the packaging substrate 402, so as to form an assembly 440.

FIG. 9G shows a process step where the assembly 430 of FIG. 9E can be further processed. More particularly, an overmold 442 is shown to cover the upper side components 104*a*, 104*b* on the non-mounting side of the packaging substrate panel 402, so as to form an assembly 450. In some embodiments, the overmold 442 at this stage can be a contiguous structure that encapsulates substantially the entire non-mounting side of the packaging substrate panel 402. The overmold 442 is shown to include a surface 444.

FIG. 9H shows that in some embodiments, a portion of the overmold 442 can be removed to form a new overmold surface 452, so as to form an assembly 460. In some embodiments, such a removal process can be achieved by, for example, a grinding process. It is noted that at this stage, each of the upper side components 104*a*, 104*b* remains encapsulated by the overmold 442 at a shallower depth from the new overmold surface 452. It is also noted that the new overmold surface 452 resulting from the removal process can be achieved to provide a desirable thickness of the assembly 460 to, for example, provide better tolerance control during subsequent processing steps.

Figures 9I, 9J:
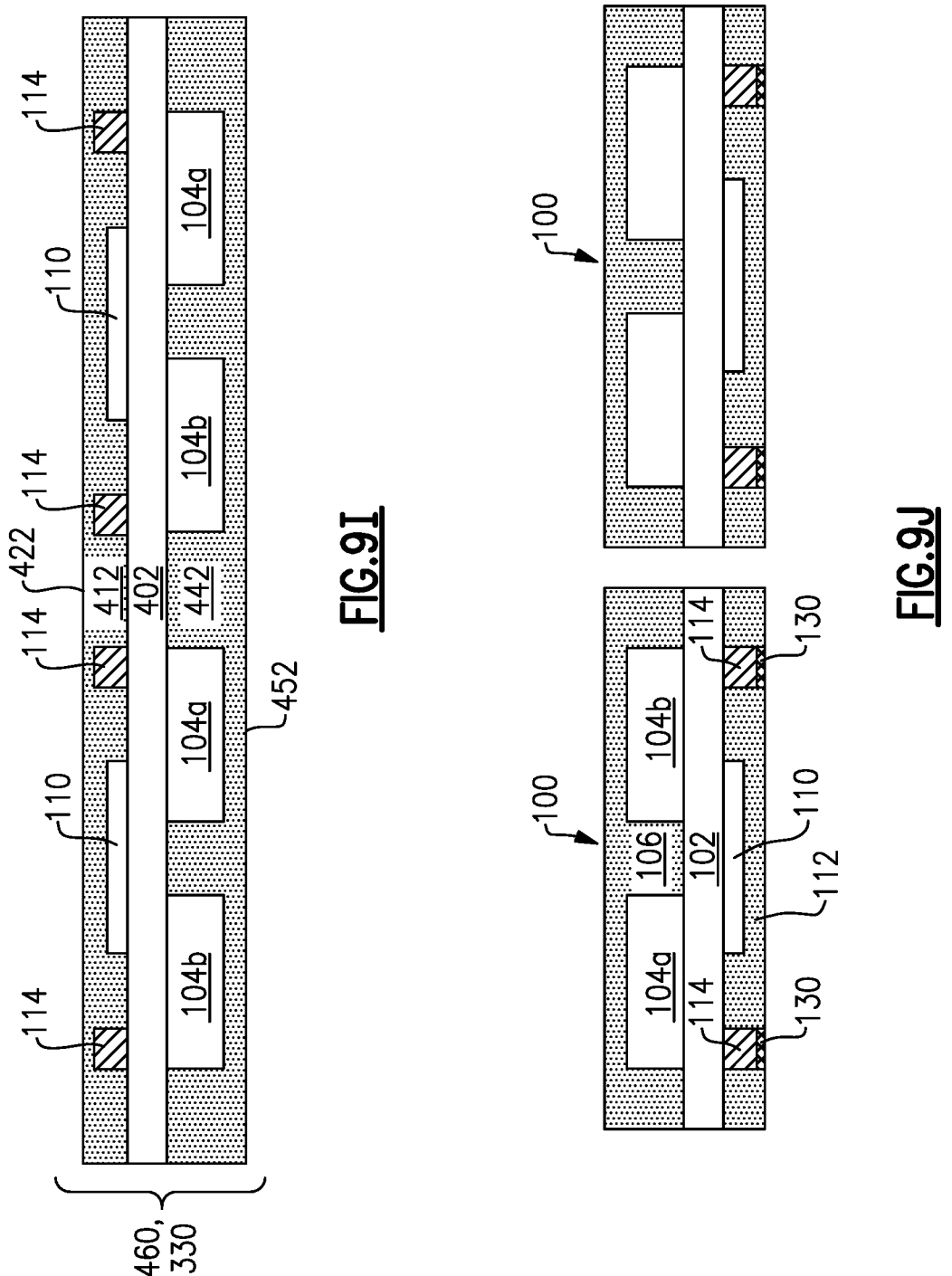

FIG. 9I shows a process step where the assembly 460 of FIG. 9H is inverted to allow further processing on the mounting side of the packaging substrate 402. Such an assembly is similar to the example assembly 330 of FIG. 7D. Accordingly, the assembly 460/330 of FIG. 9I can be further processed similar to the examples of FIGS. 7D to 7G, or similar to the examples of 8A to 8D, to result in a plurality of individual units 100 in FIG. 9J. As shown in FIG. 9J, each individual unit 100 is similar to the example packaged module 100 of FIG. 5A. It is noted that in some embodiments, the individual unit 100 of FIG. 9J may or may not be processed further to form a shielding layer.

In the various examples described herein, the conductive posts (e.g., 114 in FIGS. 4A, 4B, 5A, 5B) can be implemented with metal such as copper. It will be understood that such conductive posts can also be implemented with non-copper metal, an alloy with or without copper, etc. It will also be understood that a conductive post having one or more features as described herein can also be implemented in a ball shaped (or a portion of a ball shape) structure.

In some implementations, a device and/or a circuit having one or more features described herein can be included in an RF electronic device such as a wireless device. In some embodiments, such a wireless device can include, for example, a cellular phone, a smart-phone, a hand-held wireless device with or without phone functionality, a wireless tablet, etc.

Figure 10:
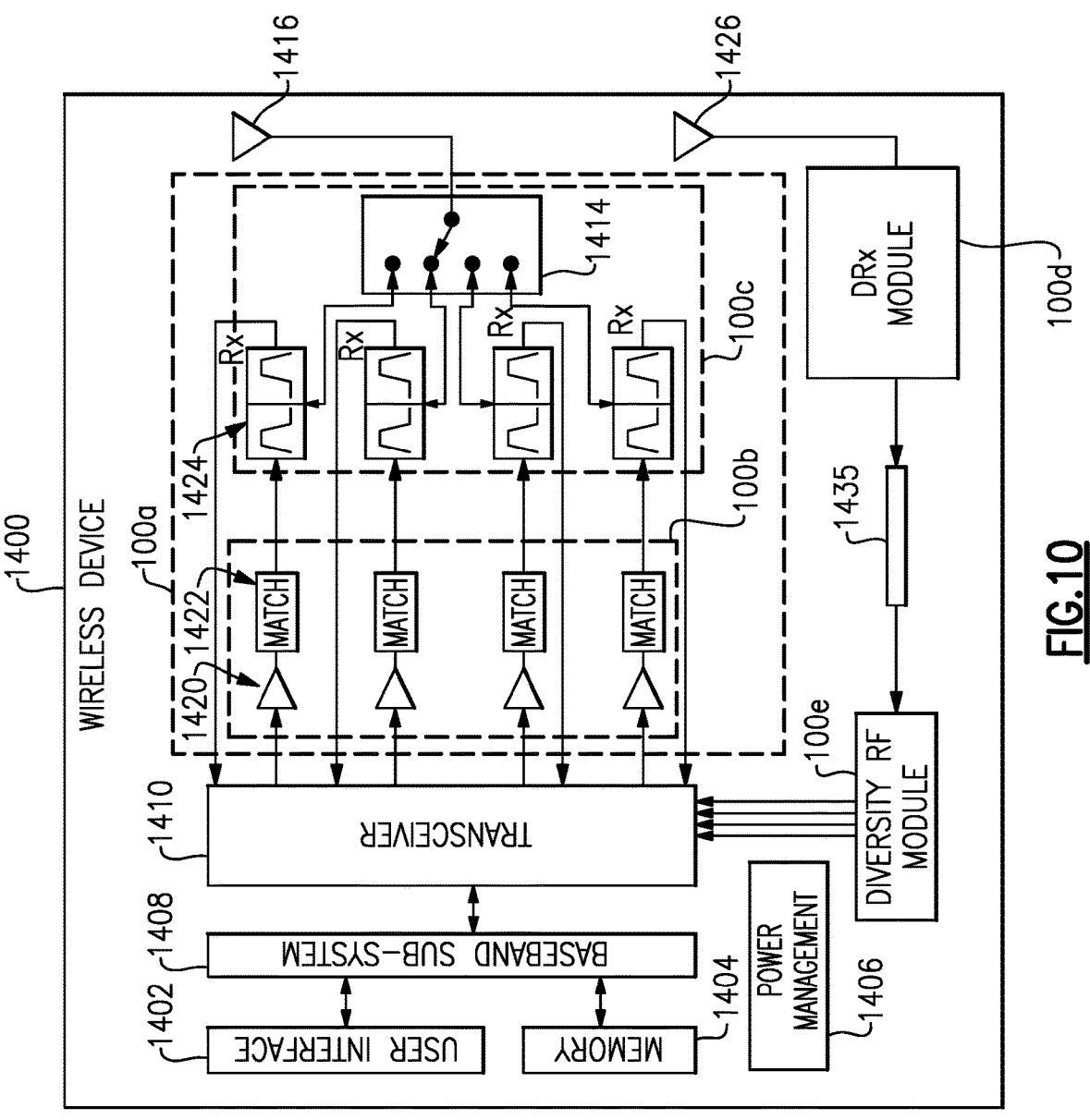
FIG. 10 depicts an example wireless device having one or more advantageous features described herein.

FIG. 10 depicts an example wireless device 1400 having one or more advantageous features described herein. In the example of FIG. 10, an RF module having one or more features as described herein can be implemented in a number of places. For example, an RF module may be implemented as a front-end module (FEM) indicated as 100*a*. In another example, an RF module may be implemented as a power amplifier module (PAM) indicated as 100*b*. In another example, an RF module may be implemented as an antenna switch module (ASM) indicated as 100*c*. In another example, an RF module may be implemented as a diversity receive (DRx) module indicated as 100*d*. It will be understood that an RF module having one or more features as described herein can be implemented with other combinations of components.

Referring to FIG. 10, power amplifiers (PAs) 1420 can receive their respective RF signals from a transceiver 1410 that can be configured and operated to generate RF signals to be amplified and transmitted, and to process received signals. The transceiver 1410 is shown to interact with a baseband sub-system 1408 that is configured to provide conversion between data and/or voice signals suitable for a user and RF signals suitable for the transceiver 1410. The transceiver 1410 can also be in communication with a power management component 1406 that is configured to manage power for the operation of the wireless device 1400.

The baseband sub-system 1408 is shown to be connected to a user interface 1402 to facilitate various input and output of voice and/or data provided to and received from the user. The baseband sub-system 1408 can also be connected to a memory 1404 that is configured to store data and/or instructions to facilitate the operation of the wireless device, and/or to provide storage of information for the user.

In the example wireless device 1400, outputs of the PAs 1420 are shown to be matched (via respective match circuits 1422) and routed to their respective duplexers 1424. Such amplified and filtered signals can be routed to a primary antenna 1416 through an antenna switch 1414 for transmission. In some embodiments, the duplexers 1424 can allow transmit and receive operations to be performed simultaneously using a common antenna (e.g., primary antenna 1416). In FIG. 10, received signals are shown to be routed to "Rx" paths that can include, for example, a low-noise amplifier (LNA).

In the example of FIG. 10, the wireless device 1400 also includes the diversity antenna 1426 and the shielded DRx module 100*d* that receives signals from the diversity antenna 1426. The shielded DRx module 100*d* processes the received signals and transmits the processed signals via a transmission line 1435 to a diversity RF module 1411 that further processes the signal before feeding the signal to the transceiver 1410.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged module comprising:
a packaging substrate having a first side and a second side;
first and second components mounted on the first and second sides of the packaging substrate, respectively;
first and second overmolds implemented on the first and second sides of the packaging substrate, respectively, the second overmold defining a mounting surface to allow mounting of the packaged module on a circuit board;
a plurality of conductive posts implemented on the second side of the packaging substrate to provide electrical connections for the packaged module, the conductive posts formed from conductive material having a sufficiently high melting temperature so that the conductive posts do not melt during a mounting operation, each conductive post having a side wall that is fully encapsulated by the second overmold and a surface that is substantially coplanar with or recessed with respect to the mounting surface of the second overmold; and
a flat solderable material layer patterned to cover the surface of each conductive post.

2. The packaged module of claim 1 wherein the conductive material includes copper.

3. The packaged module of claim 1 wherein the mounting operation includes a reflow soldering operation.

4. The packaged module of claim 1 wherein the surface of each conductive post is substantially coplanar with the mounting surface of the second overmold.

5. The packaged module of claim 4 wherein the flat solderable material layer has a thickness that protrudes beyond the mounting surface of the second overmold.

6. The packaged module of claim 5 wherein the flat solderable material layer includes a lateral edge that extends laterally beyond a lateral boundary of the surface of the respective conductive post.

7. The packaged module of claim 1 wherein the surface of each conductive post is recessed with respect to the mounting surface of the second overmold.

8. The packaged module of claim 7 wherein the flat solderable material layer is dimensioned to partially or fully fill a recess defined by the surface of the respective conductive post and the mounting surface of the second overmold.

9. The packaged module of claim 8 wherein the flat solderable material layer partially fills the recess such that an exposed surface of the flat solderable material layer and the mounting surface of the second overmold define a shallow recess.

10. The packaged module of claim 8 wherein the flat solderable material layer fully fills the recess such that an exposed surface of the flat solderable material layer is substantially coplanar with or protrudes beyond the mounting surface of the second overmold.

11. The packaged module of claim 1 further comprising a shielding layer or a shielding feature configured to provide shielding functionality.

12. A method for fabricating a packaged module, the method comprising:
forming or providing a packaging substrate having a first side and a second side;
mounting a first component on the first side of the packaging substrate;
forming a first overmold on the first side of the packaging substrate to encapsulate the first component;
mounting a second component on the second side of the packaging substrate;
implementing a plurality of conductive posts on the second side of the packaging substrate to provide electrical connections for the packaged module, the conductive posts formed from conductive material having a sufficiently high melting temperature so that the conductive posts do not melt during a mounting operation;
forming a second overmold on the second side of the packaging substrate to encapsulate the second component and each of the conductive posts;
removing a portion of the second overmold to expose a surface for each conductive post while having a side wall of the conductive post fully encapsulated by the second overmold; and
providing a flat solderable material layer patterned to cover the surface of each conductive post.

13. The method of claim 12 wherein the mounting operation includes a reflow soldering operation.

14. The method of claim 12 wherein the removing of a portion of the second overmold includes forming a recess on the mounting surface of the second overmold to expose the surface of each conductive post.

15. The method of claim 14 wherein the providing of the flat solderable material layer includes partially or fully filling the recess with the flat solderable material layer.

16. The method of claim 12 wherein the removing of a portion of the second overmold includes a grinding operation such that the new mounting surface of the second overmold is substantially planar.

17. A packaged module comprising:

a packaging substrate having a first side and a second side;

an overmold implemented on the second side of the packaging substrate, the overmold defining a mounting surface to allow mounting of the packaged module on a circuit board;

a plurality of conductive posts implemented on the second side of the packaging substrate to provide electrical connections for the packaged module, the conductive posts formed from conductive material that does not melt during a mounting operation, each conductive post having a side wall that is fully encapsulated by the overmold and a surface that is substantially coplanar with or recessed with respect to the mounting surface; and a flat solderable material layer patterned to cover the surface of each conductive post.

\* \* \* \* \*